United States Patent [19]

Lenz et al.

[11] Patent Number: 5,509,574
[45] Date of Patent: Apr. 23, 1996

[54] PACKAGE AND DISPENSING SYSTEM INCORPORATING STORAGE TUBES FOR ELECTRICAL CONNECTORS

[75] Inventors: William R. Lenz, Lockport; Arvind Patel, Naperville, both of Ill.

[73] Assignee: Molex Incorporated, Lisle, Ill.

[21] Appl. No.: 296,335

[22] Filed: Aug. 25, 1994

[51] Int. Cl.⁶ ..................................................... B65H 1/06
[52] U.S. Cl. ........................... 221/197; 221/69; 221/287; 206/499; 206/718; 220/23.86
[58] Field of Search .............................. 221/69, 197, 198, 221/287; 220/23.86; 206/451, 499, 526, 718

[56] References Cited

U.S. PATENT DOCUMENTS

| | | | |
|---|---|---|---|
| 2,231,091 | 2/1941 | Saulsbury | 221/197 X |
| 4,488,662 | 12/1984 | Fanning | 221/197 |
| 4,635,794 | 1/1987 | Lemmer | 206/328 |
| 4,655,364 | 4/1987 | Swapp et al. | 220/307 |
| 4,763,780 | 8/1988 | Zebley et al. | 206/330 |
| 4,802,325 | 2/1989 | Duncan | 53/444 |
| 4,846,345 | 7/1989 | Hamuro et al. | 206/328 |
| 5,065,897 | 11/1991 | Smith | 221/287 X |
| 5,108,004 | 4/1992 | Baldwin | 220/23.86 X |
| 5,279,415 | 1/1994 | Edgley et al. | 206/328 |

FOREIGN PATENT DOCUMENTS

2127275  5/1990  Japan .............................. B65D 85/38

*Primary Examiner*—William E. Terrell
*Assistant Examiner*—Dean A. Reichard
*Attorney, Agent, or Firm*—Stephen Z. Weiss

[57] ABSTRACT

A package is disclosed for storing and dispensing electrical connectors or components thereof. The package employs a plurality of elongated component-containing tubes in a generally parallel laterally stacked array, with opposite ends of the tubes being in generally linear alignments at opposite ends of the stacked array. An elongated, U-shaped end cap slidingly engages the opposite outer walls of the tubes along the opposite ends of the stacked array thereof. A dispensing system is disclosed wherein a pair of upright supports of a dispensing apparatus are disposed in a spaced arrangement for receiving therebetween the stacked array of tubes held together by the end caps. Complementary recessed portions located within said upright supports hold the end caps so that when the stacked array is moved beyond the recessed portions, the end caps remain in the recessed portions.

10 Claims, 3 Drawing Sheets

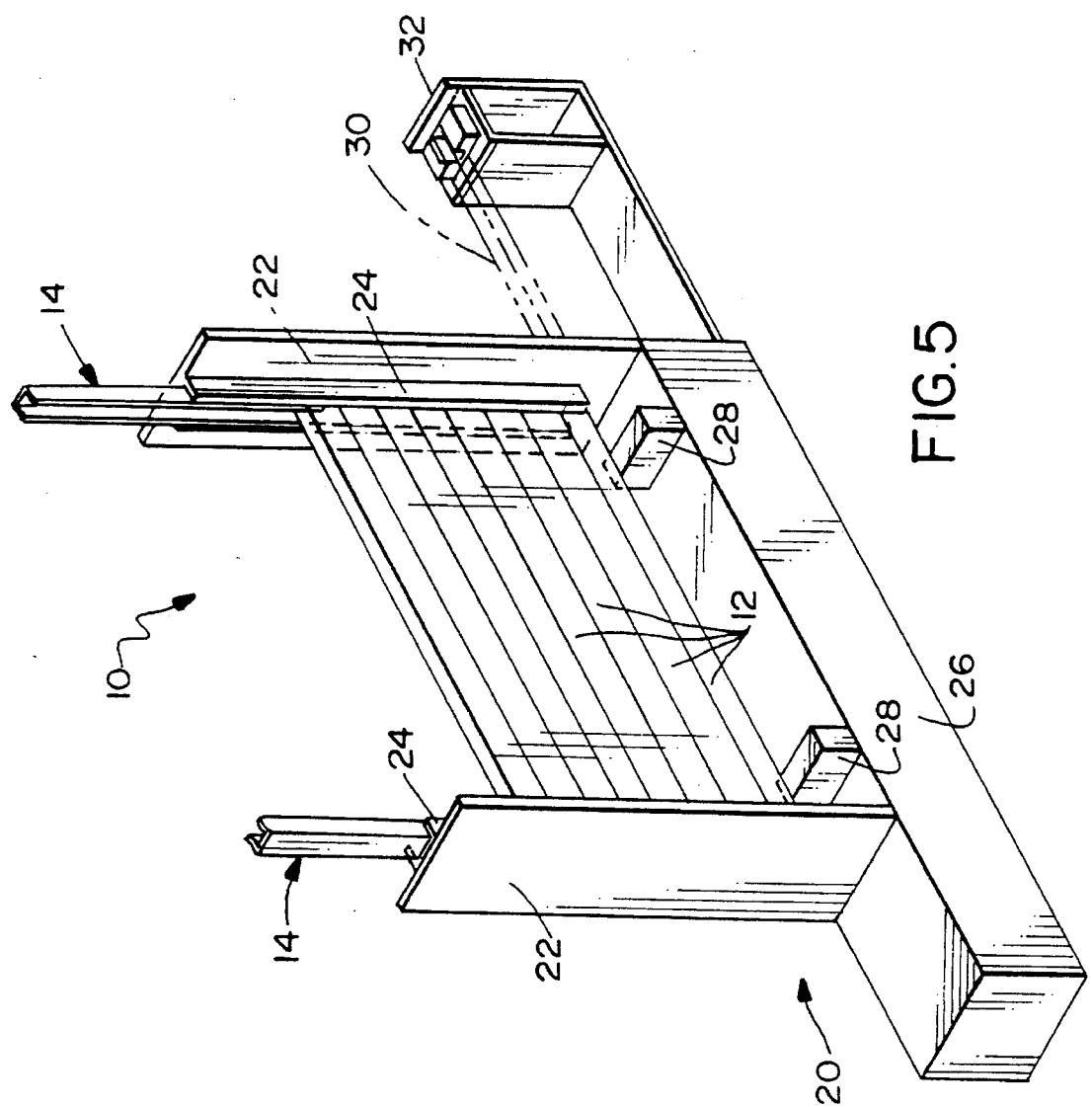

PACKAGE AND DISPENSING SYSTEM INCORPORATING STORAGE TUBES FOR ELECTRICAL CONNECTORS

FIELD OF THE INVENTION

This invention generally relates to the art of electrical connectors and, particularly, to a package for storing and dispensing electrical connectors or connector components by employing component-containing storage tubes, as well as a system for feeding the tubes in a component dispensing apparatus.

BACKGROUND OF THE INVENTION

During the manufacture of electrical connectors, integrated circuits and other electrical or electronic devices, the devices are stored in and transferred to and from various types of equipment for carrying out different manufacturing or assembling steps. For instance, the devices may be assembled, tested, inspected, and the like, during which the devices are stored, protected and handled in protective storage tubes between various manufacturing processes or machines. Most such tubes are fabricated of extruded plastic material, but the tubes may be made of metal or other appropriate material. A "rack" of the tubes may be loaded into a "magazine" of an assembly machine, with the devices being dispensed seriatim from each individual tube, whereafter the tube is discarded for dispensing devices from the successive tube in the rack.

As an example, only, such storage tubes may hold as many as twenty-five or more electrical devices for handling during manufacture. When processing is complete, the devices also may be shipped to customers in the tubes. A very large electronic manufacturer may process thousands and thousands of electronic devices in any given lot. For every one-thousand electronic devices, forty storage tubes are used. A plurality of the tubes normally are stored in a bulk container or tote box which is transferred, along with the related paperwork, between separate manufacturing processes or to the customer.

Heretofore, after the electronic devices have been completely processed or finally used by a customer, the storage tubes have been discarded as disposable items. However, with ever-increasing manufacturing volume, and with ever-increasing environmental considerations, it has become expedient to reuse or recycle such storage tubes.

A variety of different systems have been used in the prior art for holding the electronic devices within the individual storage tubes. Some systems employ tape, pins or plugs placed about, through or inserted into opposite ends of the tubes. These systems are acceptable, but they are very labor intensive to apply and remove the tape, pins or plugs, and they are not efficient for loading and feeding in a component feeding apparatus.

One packaging system has utilized a pair of elongated stop rods for holding the electronic devices in their respective tubes, and to hold a plurality of the tubes for conjoint manual manipulation. More particularly, each tube is provided with an aperture therethrough near each opposite end thereof. When a "rack" of tubes are assembled with a plurality of tubes in a generally parallel juxtaposition, the stop rods are inserted through the aligned apertures of all of the tubes in the rack to close off the ends of the tubes and to allow for manual handling of an entire rack of tubes interconnected by the rods. An improved system that employs such stop rods is shown in U.S. Pat. No. 5,279,415 to Edgley et al, dated Jan. 18, 1994, and assigned the assignee of the present invention.

Although the stop rod system, described above, has proven quite effective in many applications, certain disadvantages are encountered in some applications, particularly with very miniaturized electronic devices. In particular, the holes or slots may expand after considerable reuse or recycling. Burs may be caused during punching the holes or slots in the tube, and the burs may interfere with sliding movement of the electronic devices within the tube, such as in a component feeding apparatus. The holes or slots are expensive to punch, because of the need for a secondary (punching) operation. The holes or slots cannot be punched in small tubes, because of the tooling required to back up the punch will not fit within small tubes.

The present invention is directed to solving the above problems in a packaging system which does not require holes or slots to be punched in the tubes and does not require tape, pins or plugs to be placed about, through or inserted into the individual tubes.

SUMMARY OF THE INVENTION

An object, therefore, of the invention is to provide a new and improved package for storing and dispensing electrical connectors or electrical components in a system employing a plurality of elongated connector-containing tubes.

Another object of the invention is to provide a new and improved system for dispensing component-containing tubes in a component dispensing apparatus.

In the exemplary embodiment of the invention, the package includes a plurality of elongated component-containing tubes in a generally parallel stacked array with opposite ends of the tubes being in generally linear alignments at opposite ends of the stacked array. A pair of elongated end caps frictionally engage the sidewalls of opposite ends of the tubes along the opposite ends of the stacked array thereof.

As disclosed herein, each elongated end cap is generally U-shaped in cross-section. Each U-shaped end cap has a pair of leg portions joined by a bight portion. The bight portion is juxtaposed along one of the opposite ends of the stacked array of tubes, and the leg portions frictionally grip opposite side walls of the tubes. The bight portion is wider than the tubes, and the leg portions are biased inwardly toward each other for frictionally gripping the opposite side walls of the tubes. The elongated end caps may be unitarily fabricated of plastic, metal or like material. These tubes will not only prevent components from exiting the open ends of the tubes but will also hold the tubes together in the array. However, in certain instances where the components are larger and heavier than normal, a strap will be placed about the outer walls of the tubes in the array to help the end caps hold the tubes in the array.

The invention also contemplates a system for feeding the tubes in a component dispensing apparatus. The component dispensing apparatus includes a pair of upright supports disposed in a spaced arrangement for receiving therebetween the stacked array of tubes held together by the end caps at opposite ends of the tubes. Complementary interengaging holding means are provided between the upright supports and the end caps at a predetermined location vertically of the upright supports for preventing movement of the assembly clips while allowing the tubes to be fed downwardly past the holding means leaving the end caps behind. As disclosed herein, the pair of upright supports comprise a pair of inwardly opening channels, and the holding means are provided by stop shoulders within the channels for engaging ends of the end caps.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 5 is a view similar to that of FIG. 4, with the stacked array of storage tubes fed downwardly and leaving the end caps in elevation positions.

DETAILED DESCRIPTION OF THE PREFERRED EMBODIMENT

Figure 1:
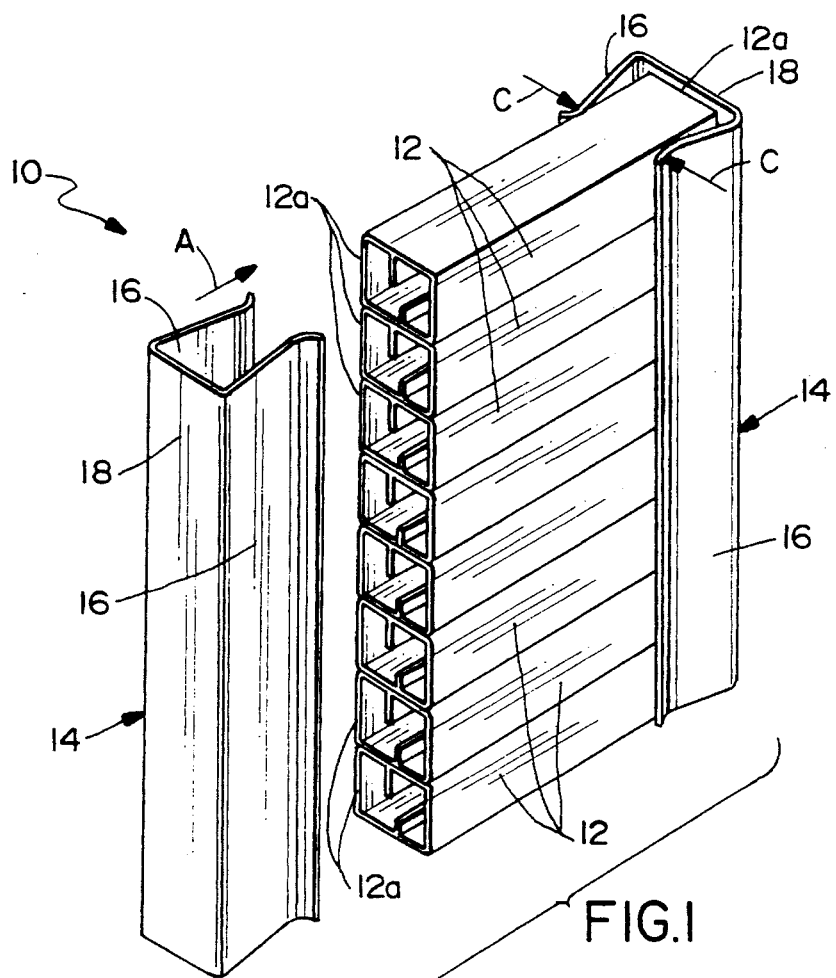
FIG. 1 is a perspective view of a stacked array of storage tubes, with one end cap engaging the tubes at one end of the array, and with another end cap removed from the tubes at the opposite end of the array to facilitate the illustration.
Figure 2:
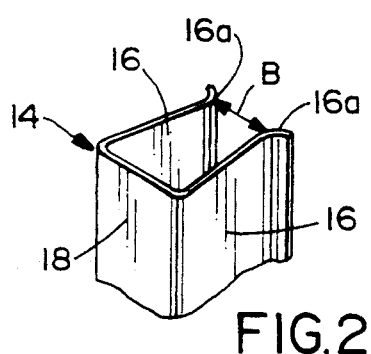
FIG. 2 is a fragmented perspective view of one end of one of the end caps.

Referring to the drawings in greater detail, and first to FIGS. 1 and 2, the invention is embodied in a package generally designated 10 (FIG. 1), for storing and dispensing electrical connectors or components thereof. The package includes a plurality of elongated connector-containing storage tubes 12 that may be oriented in a generally parallel laterally stacked array, as shown in FIG. 1, with opposite ends 12a of the tubes being in generally linear alignments at opposite ends of the stacked array. The tubes are generally hollow, except possibly for certain partitions, in order to hold a plurality of electrical connectors in a row between the opposite ends of the tubes. When the tubes are loaded into an assembly machine or a component dispensing apparatus, the connectors are dispensed seriatim in a sliding end-to-end fashion from each individual tube, usually from one end of the tube, when said tube end is moved to a dispensing station where the components are removed from the tube. After the components are removed, the tube is removed from the dispensing station of the component dispensing apparatus. Thereafter, the successive tube in the stacked array of tubes is moved to the dispensing station so that the components held therein are removed from the successive tube.

As pointed out in the "Background" above storage tubes 12 may be used for storing and transferring electrical connectors, integrated circuits and other electrical or electronic components or devices, whereby the components are stored in and transferred to and from various types of equipment for carrying out different manufacturing or assembly steps. On the other hand, completed electrical connectors can be stored and transferred in the tubes, to various machines or component feeding apparatus or even to customers. Therefore, the use of the term "component" herein and in the claims hereof is not intended to be limited to a completely finished connector construction but is intended to include other types of electrical components or devices or even components of an electrical connector.

The package 10 includes a pair of elongated assembly clips, generally designated 14, for frictionally engaging end walls of opposite ends 12a of storage tubes 12 as shown in FIG. 1. The right-hand end cap 14 is shown in position frictionally engaging the side walls near the right-hand end of the stacked array of tubes. The left-hand end cap 14 in FIG. 1 is shown removed from the stacked array of tubes, but the cap can be moved in the direction of arrow "A" for frictionally engaging the side walls near the left-hand end of the stacked array of tubes.

More particularly, each elongated end cap 14 is generally channel shaped and may be unitarily fabricated of plastic, metal or like material. In other words, each cap is generally U-shaped in cross section to define a pair of leg portions 16 joined by a bight portion 18. When assembled to the stacked array of tubes 12, as shown by the right-hand cap 14 in FIG. 1, bight portion 18 is juxtaposed along one of the opposite ends of the stacked array of tubes, and leg portions 16 frictionally grip opposite side walls of the tubes. The frictional gripping surface is extruded longitudinally with the end cap. The end cap is slidably removable in the direction parallel to the longitudinal axis of the end cap. Bight portion 18 is wider than the tubes, and leg portions 16 are biased inwardly toward each other for frictionally gripping the opposite sides of the tubes. Preferably, the distance between the gripping edges of leg portions 16, as indicated by double-headed arrow "B" (FIG. 2 and FIG. 6), is less than the width of the tubes when the end caps are in an unassembled or unstressed condition. With the tubes unitarily fabricated of plastic, metal or like material, leg portions 16 thereby are spring-loaded to frictionally grip the tubes as shown by arrows "C" (FIG. 1), as the leg portions engage the side walls near one end of the stacked array of tubes.

Figure 6:
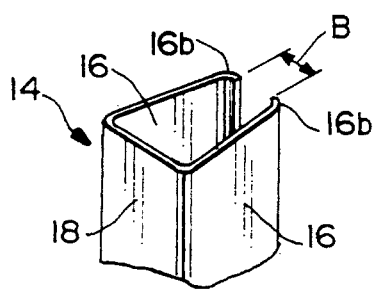
FIG. 6 is a fragmented perspective view of one end of an alternative end cap.

Lastly, the distal edges 16a (FIG. 2) of leg portions 16 are flared to facilitate assembling the end caps to the array of tubes in the direction of arrow "A" (FIG. 1). As seen in FIG. 6, an alternative end cap embodiment has the distal edges 16b of leg portions 16 being directed toward each other without any flare. The embodiment will create different frictional force characteristics between the end cap leg portions (16) and the side walls of the tubes.

Figure 3:
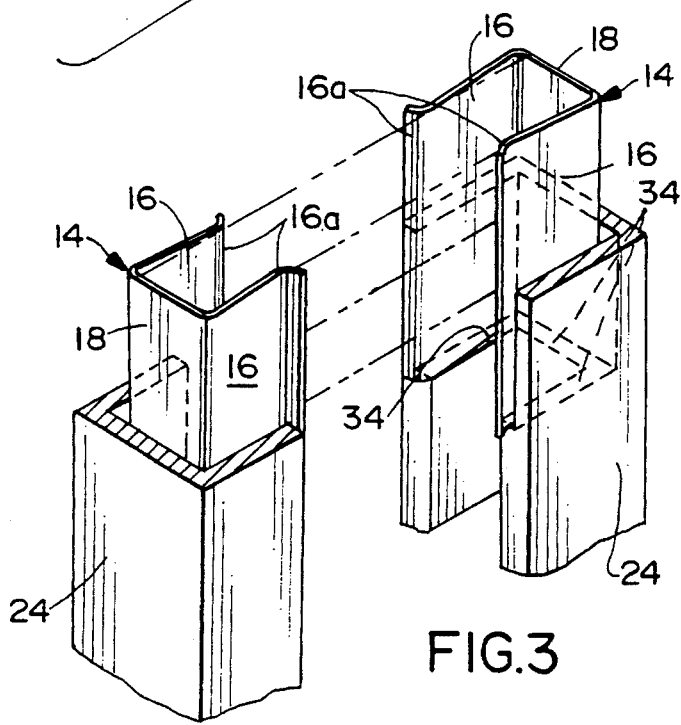
FIG. 3 is a fragmented perspective view of the end caps within a pair of upright supports of a dispensing apparatus.
Figure 4:
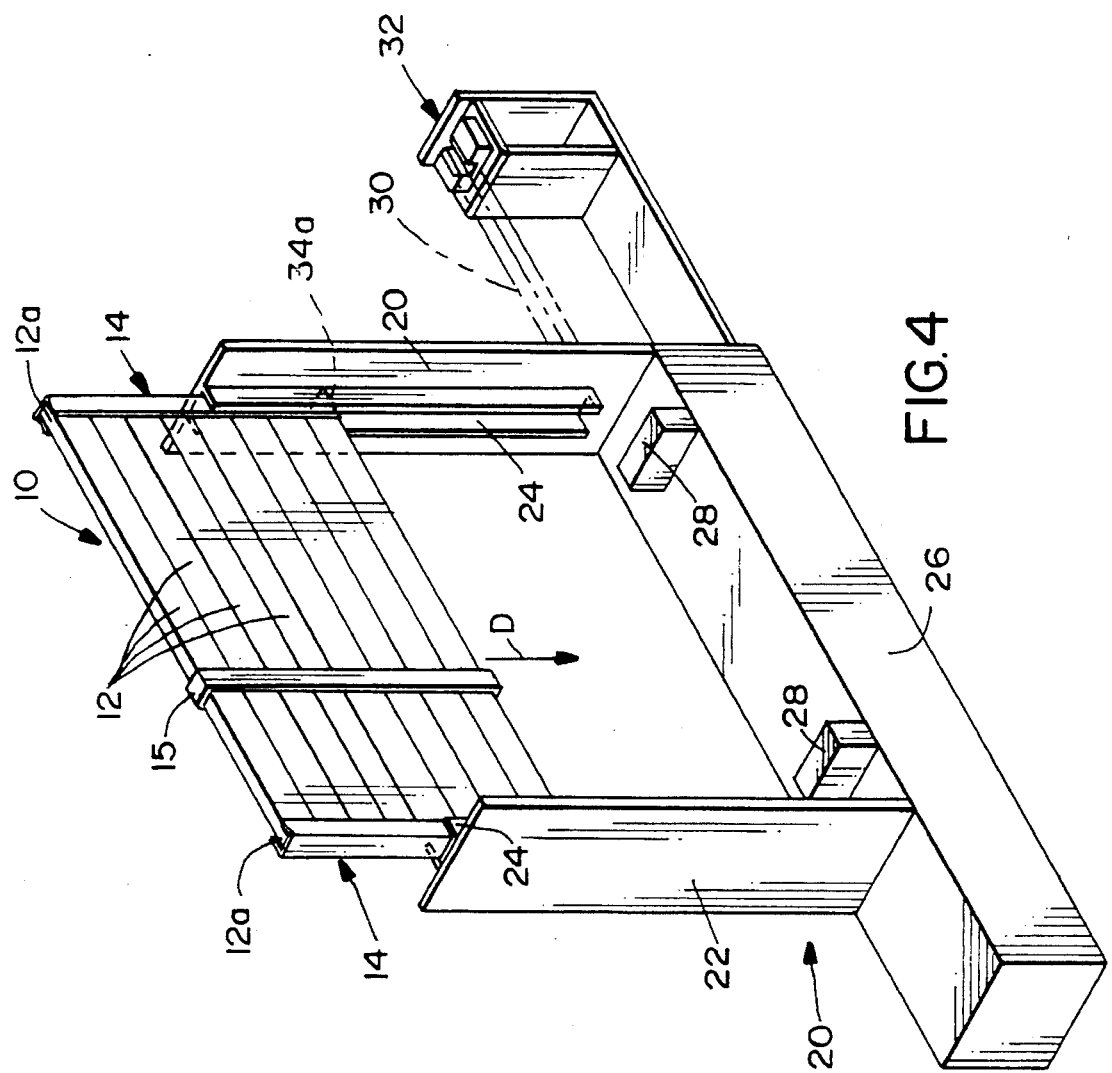
FIG. 4 is a perspective view of a stacked array of storage tubes held together by a pair of end caps and inserted into the top of a component dispensing apparatus.

The invention also contemplates a system for dispensing component-containing tubes in a component dispensing apparatus. More particularly, FIGS. 3–5 show a system wherein end caps 14 are used very advantageously in a component dispensing apparatus, generally designated 20. A plurality of tubes 12 are shown in FIG. 4 held together in a vertically stacked array by a pair of the end caps 14 at opposite ends of the array. Dispensing apparatus 20 is shown very schematically but sufficiently in detail to understand that the apparatus includes a pair of upright supports 22 disposed in a spaced arrangement for receiving therebetween the stacked array of tubes 12 held together by a pair of end caps 14. The upright supports include inwardly opening channels 24 for receiving the lower ends of end caps 14 and the opposite ends 12a of the storage tubes as described hereinafter.

Upright supports 22 project upwardly from a base 26 of dispensing apparatus 20, and a pair of support blocks 28 support the bottom-most storage tube 12 when the storage tubes are lowered as shown in FIG. 5 in the loading station. The electrical connectors or components are fed seriatim from the bottom-most tube where the tube is in the loading station along a track 30 to a pickup or assembly station, generally designated 32. After all of the connectors or components have been dispensed seriatim from the bottom-most tube, that tube is disengaged from the apparatus by blocks 28 which can also be a movable latching device and the remaining tubes are lowered with the new lower-most tube in the loading station for dispensing connectors or components from the successive tube in the vertically stacked array of tubes.

Generally, the dispensing system of the invention contemplates the provision of complementary interengaging removal means between upright supports 22 and end caps 14 at a predetermined location vertically of the upright supports for preventing movement of the end caps while allowing the tubes to be fed downwardly past the removal means into the loading station and leaving the end caps behind.

More particularly, referring to FIG. 3 in conjunction with FIG. 4, upwardly facing abutment shoulders 34 are formed on the inside of each channel 24 of the upright supports. These abutment shoulders are sized and shaped for abutting or engaging the bottom ends of assembly clips 14, as seen best in FIG. 3. Therefore, when an assembled array of tubes 12 and end caps 14 are inserted into the top of channels 24 as shown in FIG. 4, the entire array of tubes and caps come to rest on top of abutment shoulders 34.

However, in order to implement the use of tubes 12 in the dispensing apparatus 20, the optional strap 15 (FIG. 4) is first removed and the tubes are lowered in the direction of arrow "D" (FIG. 4) until the bottom-most tube comes to rest on top of blocks 28 or movable latching device in the locking station (FIG. 5). Since end caps 14 engage or grip the tubes by a frictional engagement, the tubes are allowed to be fed downwardly within channels 24 while leaving the end caps behind in their elevated positions, in engagement with abutment shoulders 34 as shown in FIG. 5. The end caps can be removed from the dispensing apparatus and reused or recycled with other stacked arrays of storage tubes. Of course, as pointed out in the "Background" above the storage tubes, themselves, can be reused or recycled after all of the connectors or components have been dispensed therefrom.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A package for storing and dispensing a plurality of electrical components stored in sliding end-to-end fashion in an array of laterally stacked tubes, said array of stacked tubes including a first tube with an open component receiving end through which components may be loaded or dispensed, a second tube adjacent the first tube with an open component receiving end adjacent the open end of the first tube, wherein opposite outer walls of said array define two separate parallel planes, and a selectively removable cover for preventing components from being dispensed from the open ends of the tubes, the improvement comprising:

said cover including an elongated U-shaped resilient end cap slidingly engaged against the outer wall of the array of stacked tubes in a direction parallel to the longitudinal axis of the end cap covering the open ends thereof and maintaining the tubes in their lateral stacked array;

whereby, when the end cap is slidably disengaged in the direction parallel to the longitudinal axis of the end cap from the outer walls of one or more of the tubes in an array, those one or more tubes will be separated from the array and their open ends will be uncovered allowing the components within to be dispensed therefrom.

2. The package of claim 1 wherein said end cap has a pair of leg portions joined by a bight portion, with the bight portion juxtaposed along said open ends of the tubes in the stacked array and the leg portions frictionally gripping opposite outer walls of the tubes.

3. The package of claim 2 wherein each tube has two open ends and one end cap frictionally engages the outer walls of the array near each open end of each tube.

4. A package for storing and dispensing a plurality of electrical components stored in a sliding end-to-end fashion in an array of laterally stacked tubes, said array of stacked tubes including a first tube with an open component receiving end through which components may be loaded or dispensed, a second tube adjacent the first tube with an open component receiving end adjacent the open end of the first tube, wherein outer walls of said array define two separate parallel planes, and a selectively removable cover for preventing components from being dispensed from the open ends of the tubes, the improvement comprising:

said cover including an elongated U-shaped resilient end cap having a pair of leg portions biased inwardly toward each other joined by a bight portion with the bight portion being wider than the tubes and juxtaposed along said open end of the stacked array of tubes the leg portions frictionally and slidingly gripping the opposite outer walls of the array of stacked tubes covering the open ends thereof and maintaining the tubes in their lateral stacked array;

whereby, when the end cap is slidably disengaged from the outer walls of one or more of the tubes in an array, those one or more tubes will be separated from the array and their open ends will be uncovered allowing the components within to be dispensed therefrom.

5. The package of claim 4 wherein said end cap is unitarily fabricated of plastic material.

6. The package of claim 4 wherein said end cap is unitarily fabricated of metal material.

7. A system for dispensing a plurality of electrical components stored in a sliding end-to-end fashion in an array of laterally stacked tubes at a loading station, said array of laterally stacked tubes including a first tube with an open component receiving end through which components may be loaded or dispensed, a second tube adjacent the first tube with an open component receiving end adjacent the open end of the first tube, all of said tubes having opposite outer walls forming two separate parallel planes, and a selectively removable cover for preventing components from being dispensed from the open ends of the tubes, said system including a component dispensing apparatus for receiving said stacked tubes and dispensing said components, said apparatus having means for holding the first tube in a position adjacent the loading station, means for removing the cover to allow said first tube to be moved into said loading station and to allow components to be dispensed from the open end thereof while at the loading station, and means for releasing the first tube from the loading station after the components are dispensed therefrom and allowing the second tube to be positioned adjacent the loading station, the improvement comprising:

said cover including an elongated, U-shaped resilient end cap slidingly engaging the outer walls of the array of stacked tubes to cover the open ends thereof;

said means for removing the cover including complementary engaging means between said end cap and said dispensing apparatus such that, when the array of stacked tubes is moved toward the loading station, the first tube will slidingly disengage from said end cap and move toward a position where the open end of the first tube will be next to the loading station to allow dispensing of components therefrom while said end cap covers the open ends of the tubes remaining in said array.

8. The system of claim 7 wherein said dispensing apparatus includes a pair of upright supports disposed in a spaced arrangement for receiving therebetween the stacked array of tubes held together by said end cap at opposite ends of the tubes.

9. The system of claim 8 wherein said complementary engaging means comprise abutment shoulder means on said upright supports for engaging lower ends of said end cap.

10. The system of claim 9 wherein said upright supports include inwardly directed channels for receiving therewithin the stacked array of tubes held together by said end cap.

* * * * *